United States Patent [19]

Gabuzda et al.

[11] Patent Number: 4,715,438
[45] Date of Patent: Dec. 29, 1987

[54] STAGGERED RADIAL-FIN HEAT SINK DEVICE FOR INTEGRATED CIRCUIT PACKAGE

[75] Inventors: Paul G. Gabuzda, Laguna Beach; Sanford V. Terrell, Laguna Hills, both of Calif.

[73] Assignee: Unisys Corporation, Detroit, Mich.

[21] Appl. No.: 880,427

[22] Filed: Jun. 30, 1986

[51] Int. Cl.[4] .............................................. F28F 7/00
[52] U.S. Cl. .................................... 165/185; 357/81; 174/16 HS
[58] Field of Search ..................... 165/80.3, 80.4, 185; 174/16 HS; 357/81

[56] References Cited

U.S. PATENT DOCUMENTS

| | | | |
|---|---|---|---|
| 3,180,404 | 4/1965 | Nelson et al. | 165/185 |
| 3,220,471 | 11/1965 | Coe | 174/16 HS X |
| 3,239,003 | 3/1966 | Boudette et al. | 174/16 HS |
| 3,313,339 | 4/1967 | Coe | 165/185 X |
| 3,342,255 | 9/1967 | Risk et al. | 165/80.3 |
| 3,592,260 | 7/1971 | Berger | 165/185 X |
| 3,780,356 | 12/1973 | Laing | 165/80.4 X |
| 4,587,595 | 5/1986 | Stapler | 165/185 X |
| 4,607,685 | 8/1986 | Mitchell, Jr. | 165/185 |

Primary Examiner—Albert W. Davis, Jr.
Assistant Examiner—Peggy A. Neils
Attorney, Agent, or Firm—Alfred W. Kozak; Nathan Cass; L. Joseph Marhoefer

[57] ABSTRACT

A radial fin heat sink whereby a spreader plate supports a series of radial fins which are staggered around a central open cylindrical area designed to receive a flow of air by impingement. The radial fins comprise a pattern of variable lengths which follow in succession from a major length to a minor length to an intermediate length which pattern repeats around the periphery of the spreader plate.

6 Claims, 9 Drawing Figures

FIG. 2A. TOP VIEW
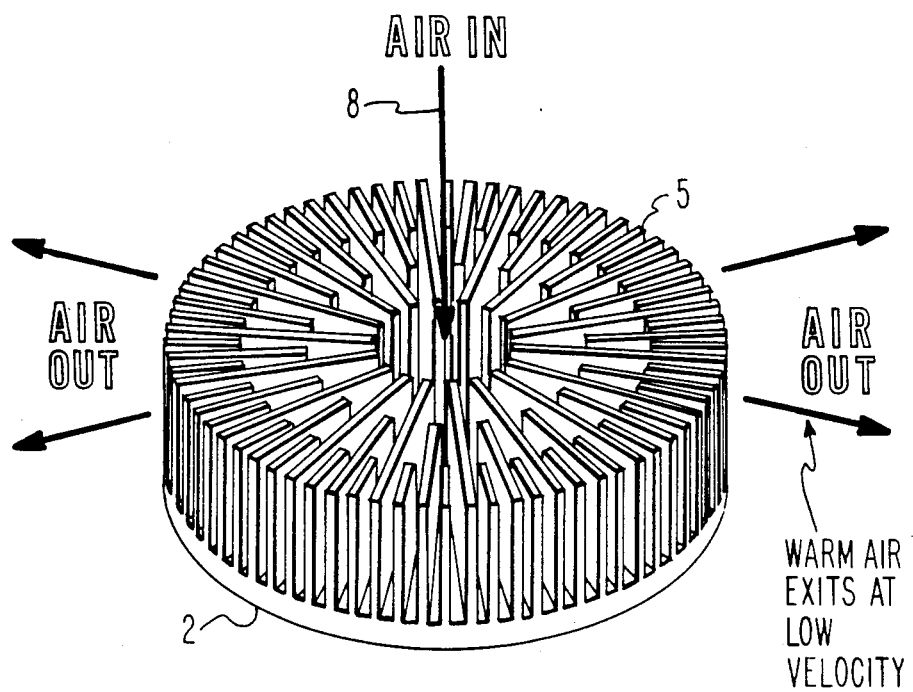
FIG. 2B. BOTTOM VIEW
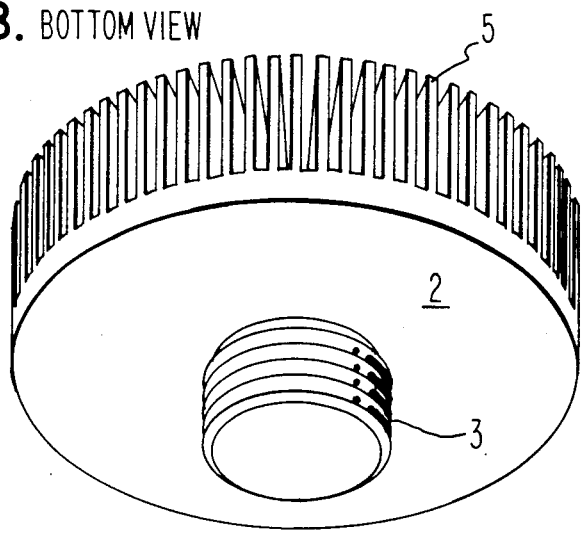

STAGGERED RADIAL-FIN HEAT SINK DEVICE FOR INTEGRATED CIRCUIT PACKAGE

FIELD OF THE INVENTION

This disclosure relates to specialized heat sinks used for cooling of integrated circuit package components.

BACKGROUND OF THE INVENTION

In modern day digital equipment, there has been developing a greater and greater density of packaging on printed circuit boards and a higher density of printed circuit boards in computer and digital cabinetry. In this situation there have been numerous ways developed to reduce the generation of heat and to carry away excessive heat build up.

One of the basic ways of doing this has been to develop metallic fins and other heat conducting means by which cooling air can be used to carry away the heat that has been built up.

One of the major problems has been to provide for a maximization of the heat reduction and yet to be economically feasible combined with ease of application to areas which are restricted in space and cooling capacity.

SUMMARY OF THE INVENTION

The presently disclosed heat sink device provides for a greater and more developed cooling area which both diminishes any blockage of the air flow and permits more rapid air flow over its surface area in order to provide an efficient cooling action while yet maintaining the device in a closely restricted spatial area.

A radial fin heat sink device is described whereby a spreader plate supports a series of radial fins which are staggered around a central open cylindrical area which receives a flow of air by impingement.

The radial fins are of variable lengths so as to provide extra surface area to the package without blockage of the air which flows from the central opening outward to the periphery or circumference of the package.

The lower portion or the central opening has a hub or raised hemisphere area which provides for an even distribution and allocation of incoming air flow from the central area to the peripheral areas.

This heat sink package provides an exceptionally large surface area for the distribution of air flow without actually blocking the air flow from the central area to the peripheral area to any measurable degree. The design also establishes a gradual reduction in air velocity and dissipation of kinetic energy, so that the air discharges at a low velocity, with a minimum of noise and with little disruption to the air flow of neighboring electronic devices.

BRIEF DESCRIPTION OF THE DRAWINGS

FIG. 2A shows perspective views of the topside and FIG. 2B shows the underside of the circular base heat sink;

DESCRIPTION OF PREFERRED EMBODIMENT

Figure 1:
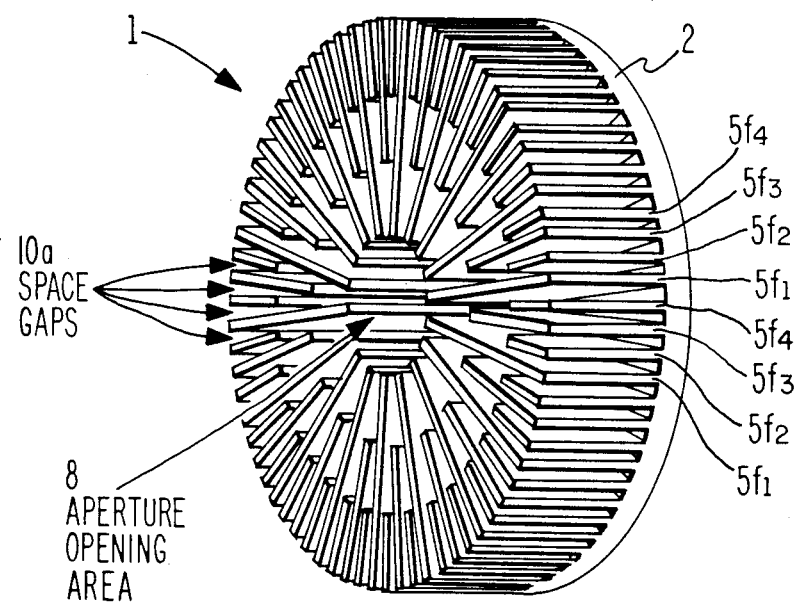
FIG. 1 is a side view in perspective of the heat sink with a circular base configuration.

Referring to FIG. 1 the staggered radial fin heat sink device is shown in perspective view.

The device 1 is supported by a base plate or spreader plate 2 onto which is cast a series of circumferential fin plates which are radially oriented, that is to say their line of extension goes from the center point of the radial spreader plate over to the circumference of the spreader plate.

The fins 5 are seen to be evenly spaced from each other at the circumferential area and are designated in sectors, for example as $5f_1$, $5f_2$, $5f_3$, $5f_4$, which is used to illustrate how the first fin is of a major length, the second is of a minor length while the third fin is of an intermediate length after which the fourth fin is of the minor length.

This pattern of a major length fin adjacent to a minor length fin which is then adjacent to an intermediate length fin which is then adjacent to a minor length fin—this pattern is repeated in sectors over and over throughout the circumference of the spreader plate 2.

The central aperture or orifice area 8 is used to receive a steady flow of impinging air which flows from the top to the bottom of the device in order to impinge upon the spreader plate area 2, and then to fan out towards the circumference, its velocity being slowed to a quiet flow by the fin configuration.

FIG. 2A and FIG. 2B shows a perspective view of the top side of the radial fin heat sink and also the underside of the radial fin heat sink.

As previously described, the central aperture area 8 permits the impingement of incoming air which strikes the base plate and is then dispersed outwardly to the circumferential areas.

In the underside view of FIG. 2B, there are seen the fins 5, the base plate 2 from which there extends a threaded extension 3 which can be threaded into the packaging of an integrated chip.

Alternatively if the threaded extension 3 is not used, then the base plate 2 can be connected to the integrated circuit by use of a heat conducting adhesive, or by soldering or brazing.

Figure 3A:
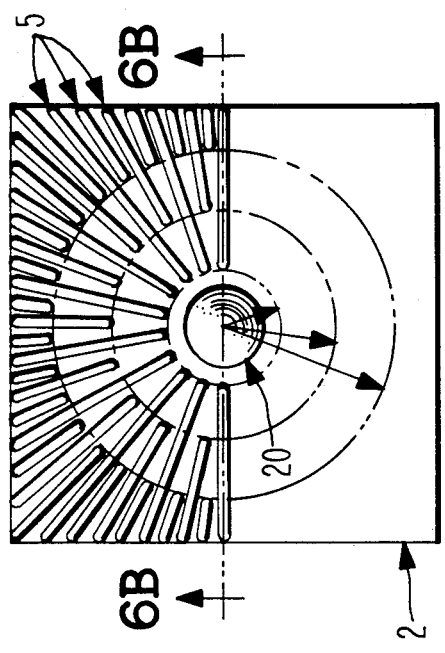
FIG. 3A is a top plan view and FIG. 3B shows a side cross section of the circular base heat sink.

As seen in FIG. 3A, the base of the opening aperture area 8 is provided with a raised hemisphere 20 which provides for an even dispersion of air toward the circumferential or peripheral areas of the heat sink. As also seen in FIGS. 1 and 3A, the open air passages between adjacent fins are shown designated as $10_a$.

Figure 3B:
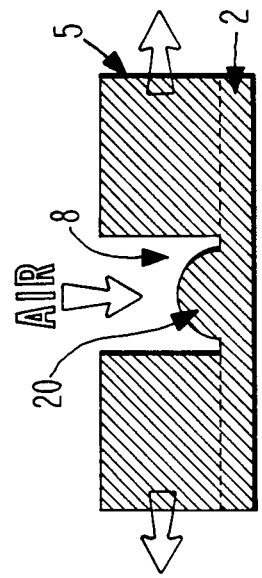

Referring to FIG. 3B, there is seen a cross sectional view of the heat sink device 1 showing the base plate or spreader plate 2 and the radial fin elements 5 such that the air flow impingement shown by the arrow A is diverted by the hemisphere 20 and dispersed throughout the circumference of the heat sink device in order to provide cooling air throughout each of the major length fins, minor length fins and the intermediate length fins.

Figure 4:
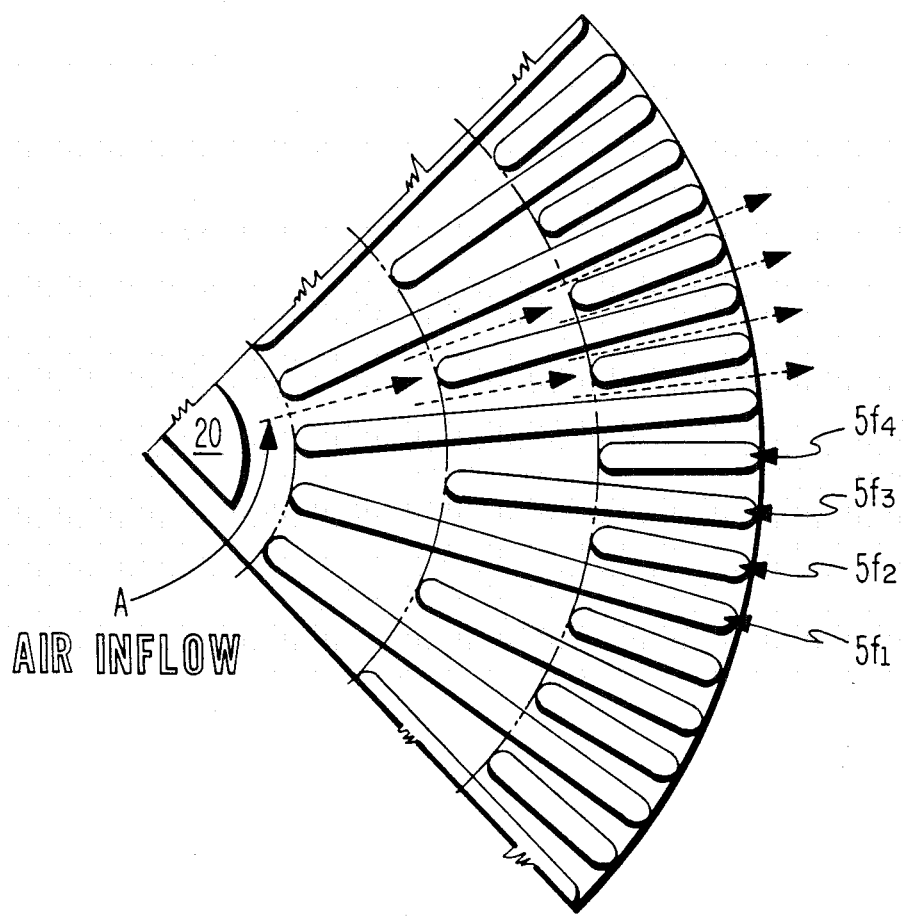
FIG. 4 is a sketch of one sector of the heat sink showing the paths of air flow.

Additionally, in FIG. 4 there is seen an air flow diagram indicating by means of a set of dash lines the path of the air flow from the center for a single sector which constitutes one-twelfth of the circumference of the radial fin heat sink.

As the air flows between the fins, kinetic energy is dissipated and the air velocity is diminished, as the area available for the air to flow increases. In this way, the energy of the air is dissipated as it flows through the heat sink. The air is discharged at a low velocity, thereby minimizing the generation of noise by air turbulence and interference with the air flow needed for the proper cooling of adjacent electronic components.

FIG. 4 illustrates a "sector" of fin elements as $5f_1$, $5f_2$, $5f_3$, and $5f_4$ which form the velocity dissipating pattern for air flow.

Figure 5:
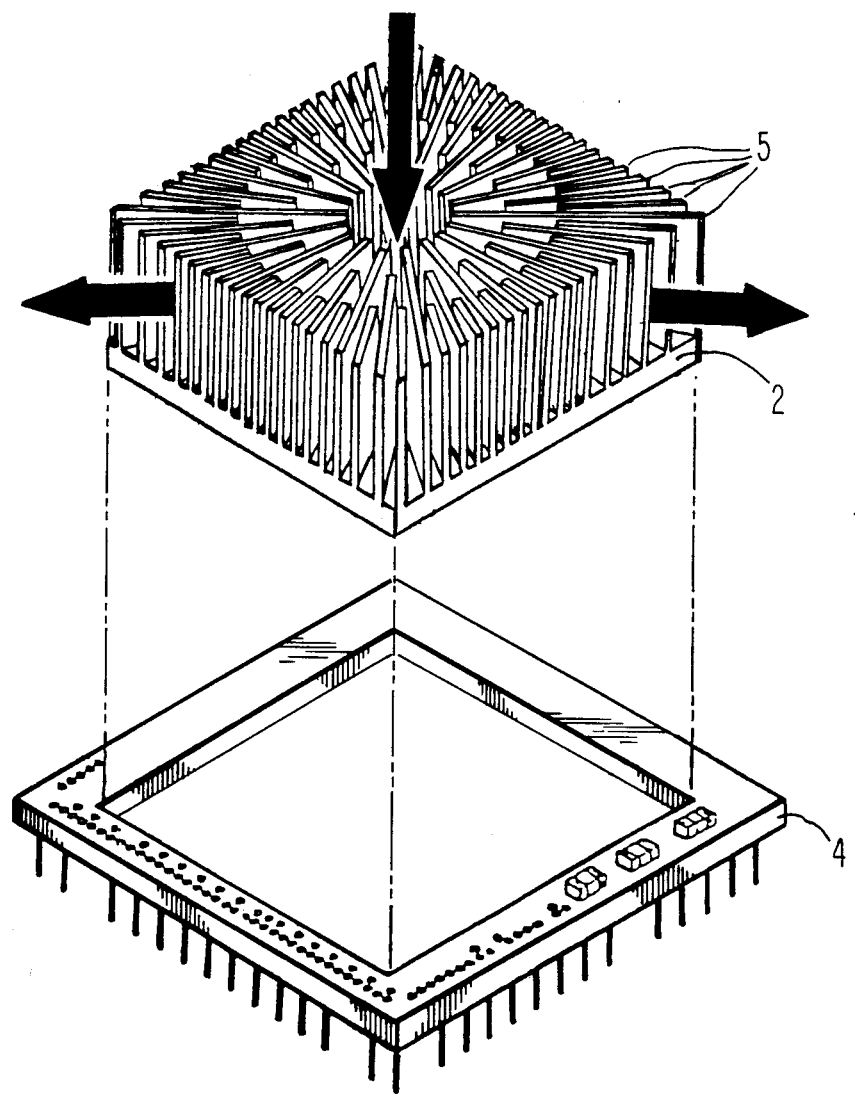
FIG. 5 is a side view in perspective of the heat sink with a square base configuration.

FIG. 5 shows a square base configuration with fin elements 5 on base plate 2 which supports the sectors of the previously described fin pattern of variable radial fin lengths. The base plate 2 mounts on the integrated circuit package 4.

Figure 6A:
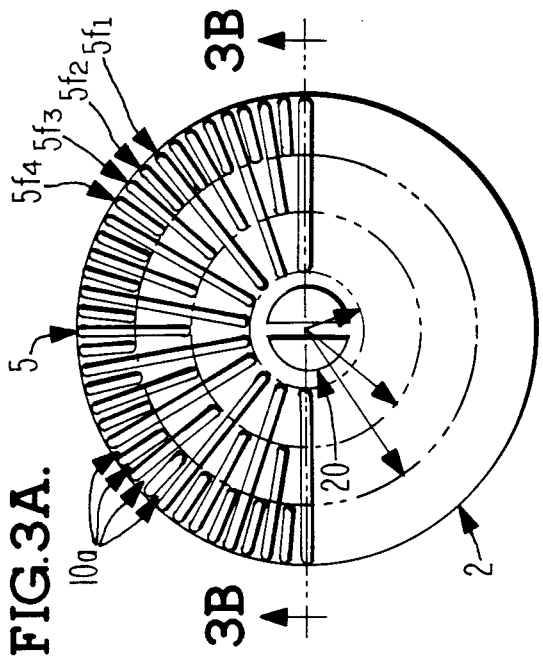
FIG. 6A is a top plan view and FIG. 6B is a side cross section view of the square base heat sink.
Figure 6B:
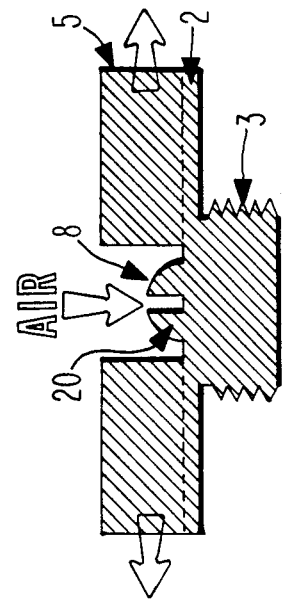

FIGS. 6A and 6B illustrate in plan view and cross section, respectively, the square base configuration 2 supporting the radially oriented fin elements 5 around the aperture 8 which surrounds the dome unit 20. The dome unit 20 may consist of a spherical headed screw with a slit for a screwdriver.

Thus, with the configurations presented by these embodiments, there is provided an unusually high quantity of surface area through which the impinging air may flow, thus providing a highly efficient removal of accumulated heat from the heat sink and its attached integrated circuit unit.

There has been described herein an efficient heat sink device which can be applied either by adhesives, solder or braze, or mechanical screw attachment to the top of an integrated circuit device. This radial heat sink device is uniquely provided with variable lengths of heat conducting fins which repeat in a regular pattern of long length, short length, intermediate length, short length, long length, etc. in a repetitive fashion. The central area of the heat sink device is provided with an opening or aperture through which impingement of air can strike and disperse over a raised hemisphere at the bottom center of the spreader plate of the heat sink, thus to evenly dispense the cooling air throughout the circumferential areas of the device.

Although a preferred embodiment has been illustrated, other configurations of the described heat sink may be practiced but which still fall within the concept as defined in the attached claims.

What is claimed is:

1. A heat sink device for attachment to an integrated circuit package and placed perpendicular to an impinging air flow, said device comprising:
   (a) a circular metallic base plate attachable to an integrated circuit package unit, and supporting a plurality of metallic fin elements wherein the said base plate includes:
      (a1) a hemispheric dome at the center of said base plate for the purpose of receiving and dispersing said impinging air flow directed perpendicular to said base plate;
   (b) said plurality of metallic fin elements equally spaced with air space interstices around the periphery of said base plate wherein said fin elements constitute a pattern of long, intermediate and short lengths oriented in the radial direction to form a repetitive sector pattern wherein said repetitive sector pattern includes:
      (b1) a sequence of said radial fin element lengths which follow the pattern of long-short-intermediate-short, which pattern repeats through each sector of the circumference of said heat sink device; and wherein
      (b2) the width of each of said plurality of fin elements is of the same dimension, and
      (b3) the width of each of the said air space interstices between adjacent fin elements is substantially the same as the width of each of said fin elements;
   (c) a central cylindrical open space situated at the central area of said base plate to permit the perpendicular impingement of said air flow onto said base plate.

2. A radially finned heat sink device for attachment to an integrated circuit package comprising:
   (a) a plurality of radially oriented heat conductive fin elements evenly spaced around the periphery of a base plate, and having radial air-gaps therebetween; and wherein,
      (a1) said radial air-gaps have a width at said periphery which is substantially equal to the width of each of said fin elements; and
      (a2) said fin elements follow a repetitive pattern of lengths of "long-short-medium-short"; and
      (a3) said long length fin elements being truncated near the center of said base plate to form a central chamber-like cylindrical space for receiving impinging air flow directed perpendicular to said base plate;
   (b) said base plate for supporting said heat conductive fin elements and fabricated of heat conductive material having a flat underside for juxtaposition to said integrated circuit package.

3. The heat sink device of claim 2 wherein the said base plate supports a hemispheric dome at the center of said base plate within said cylindrical space and wherein said dome extends upward toward the source of impinging air.

4. The heat sink device of claim 3 which includes:
   (i) menas for directing high velocity impinging air flow into said cylindrical space and onto said hemispheric dome in a direction perpendicular to said base plate.

5. A heat sink device for attachment to an integrated circuit package comprising:
   (a) a metallic base plate made of heat conductive material for attachment to an integrated circuit package;
   (b) a plurality of radially oriented fin elements organized in group sectors and placed around the center of said base plate and having equidistant separating air spaces between each of said fin elements at the periphery of said base plate, each of said fin elements having the same width, and wherein
      (b1) each of said separating air spaces has a width substantially equal to the width of each of said fin elements;
   (c) and wherein each group sector of said fin elements occupy a radial sector of said base plate and form a pattern in each group sector whereby a plurality of said fin elements occupy said group sector and form a repetitive pattern of lengths of long-short-intermediate-short for each group sector;
   (d) a central chamber-like cylindrical space on said base plate for receiving a high velocity impinging air flow directed perpendicular to said base plate, said cylindrical space having a diameter substantially less than the length of said long fin elements.

6. The heat sink device of claim 5 wherein said central cylindrical space includes a hemispheric dome which confronts said impinging air flow on the central area of said base plate to provide an even dispersion of the incoming air flow past said fin elements and toward the peripheral areas of said base plate.

* * * * *